United States Patent [19]

Ogawa et al.

[11] Patent Number: 4,465,750

[45] Date of Patent: Aug. 14, 1984

[54] PHOTOCONDUCTIVE MEMBER WITH A-SI HAVING TWO LAYER REGIONS

[75] Inventors: Kyosuke Ogawa, Sakurashinmachi; Shigeru Shirai, Yamato; Junichiro Kanbe, Yokohama; Keishi Saitoh, Tokyo; Yoichi Osato, Kawasaki, all of Japan

[73] Assignee: Canon Kabushiki Kaisha, Tokyo, Japan

[21] Appl. No.: 449,418

[22] Filed: Dec. 13, 1982

[30] Foreign Application Priority Data

Dec. 22, 1981 [JP] Japan .................................. 56-208493
Dec. 22, 1981 [JP] Japan .................................. 56-208494
Dec. 22, 1981 [JP] Japan .................................. 56-208495

[51] Int. Cl.$^3$ ............................................. G03G 5/082
[52] U.S. Cl. ........................................ 430/57; 430/84; 430/95; 252/501.1; 427/74; 357/2
[58] Field of Search .................. 430/57, 84, 85, 86, 430/95; 252/501.1; 427/74; 357/2

[56] References Cited

U.S. PATENT DOCUMENTS

| | | | |
|---|---|---|---|
| 3,210,184 | 10/1965 | Uhlig | 430/65 |
| 4,217,374 | 8/1980 | Ovshinsky et al. | 430/84 X |
| 4,226,898 | 10/1980 | Ovshinsky et al. | 430/84 X |
| 4,239,554 | 12/1980 | Yamazaki | 136/255 |
| 4,251,289 | 2/1981 | Moustakas et al. | 204/192 |
| 4,253,882 | 3/1981 | Dalal | 427/74 X |
| 4,265,991 | 5/1981 | Hirai et al. | 430/65 X |
| 4,289,822 | 9/1981 | Shimada et al. | 427/74 X |
| 4,423,133 | 12/1983 | Kanbe et al. | 430/84 X |

FOREIGN PATENT DOCUMENTS 2083701 3/1982 United Kingdom .................. 357/2

*Primary Examiner*—Roland E. Martin
*Attorney, Agent, or Firm*—Fitzpatrick, Cella, Harper & Scinto

[57] ABSTRACT

A photoconductive member comprises a support and an amorphous layer compsed of a first layer region composed of a photoconductive amorphous silicon containing p- or n-type impurity distributed nonuniformly and continuously in the layer thickness direction, and a second layer region composed of $Si_aC_{1-a}$ ($0.4 < a < 1$), $[Si_bC_{1-b}]_cH_{1-c}$ ($0.5 < b < 1$, $0.6 \leq c < 1$), $[Si_dC_{1-d}]_eX_{1-e}$ ($0.47 < d < 1$, $0.8 \leq e < 1$, X: halogen) or $[Si_fC_{1-f}]_g(H+X)_{1-g}$ ($0.47 < f < 1$, $0.8 \leq g < 1$, X: halogen].

31 Claims, 12 Drawing Figures

PHOTOCONDUCTIVE MEMBER WITH A-SI HAVING TWO LAYER REGIONS

BACKGROUND OF THE INVENTION

1. Field of the Invention

This invention relates to a photoconductive member having sensitivity to electromagnetic waves such as light (herein used in a broad sense, including ultraviolet rays, visible light, infrared rays, X-rays and gamma-rays and the like).

2. Description of the Prior Art

Photoconductive materials constituting image forming members for solid state image pick-up devices, electrophotographic image forming members in the field of image formation, or manuscript reading devices are required to have a high sensitivity, a high SN ratio [Photocurrent (Ip)/Dark Current (Id)] absorptipn spectral characteristics matching to the spectral characteristics of irradiating electromagnetic waves, a good response to light, a desired dark resistance value as well as no harm to human bodies during usage. Further, in a solid state image pick-up device, it is also required that the residual image should be easily treated within a predetermined time. In particular, in case of an image forming member for electrophotography to be assembled in an electrophotographic device to be used in an office as office apparatus, the aforesaid harmless characteristic is very important.

From the standpoint as mentioned above, amorphous silicon (hereinafter referred to as "a-Si") has recently attracted attention as a photoconductive material. For example, German Laid-Open Patent Publication Nos. 2746967 and 2855718 disclose applications of a-Si for use in image forming members for electrophotography, and German Laid-Open Patent Publication No. 2933411 and application of a-Si for use in a photoconverting reading device.

However, under the present situation, although the photoconductive members having photoconductive layers constituted of a-Si of the prior art have been attempted to be improved with respect to individual characteristics, including various electrical, optical and photoconductive characteristics such as dark resistance value, photosensitivity and response to light, environmental characteristics in use, and further stability with lapse of time and durability, there exists room for further improvement in overall characteristics.

For instance, when the a-Si photoconductor is applied to an image forming member for an electrophotographic device, residual potential is frequently observed to remain during use thereof if increases in photosensitivity and dark resistance are contemplated.

When such a photoconductive member is repeatedly used for a long time, there will be caused various inconveniences such as accumulation of fatigues by repeated uses or so-called ghost phenomenon wherein residual images are formed.

Further, a-Si materials may contain as constituent atoms hydrogen atoms or halogen atoms such as fluorine atoms, chlorine atoms, etc. for improving their electrical, photoconductive characteristics, and boron atoms, phosphorus atoms, etc. for controlling the electroconductivity type, and further other atoms for improving other characteristics. Depending on the manner in which these constituent atoms are contained, there may sometimes be caused problems with respect to electrical or photoconductive characteristics or dielectric strength of the layer formed.

For example, there are problems as shown below. Life of photocarriers produced in the formed photoconductive layer by irradiation is not sufficiently long in the layer. Images transferred to a receiving paper often suffer from defective images, so-called "blank areas", caused by a local discharge breakdown. When a blade is used for cleaning, another defective images, so-called "white lines", are produced which seem to be produced due to rubbing with the blade. Further, when the photoconductive layer is used in a highly humid atmosphere or is used directly after standing it in a highly humid atmosphere for a long time, there are often produced disadvantageously so-called "unfocused images".

Thus, it is required in designing a photoconductive material to make efforts to overcome all of such problems as mentioned above along with the improvement of a-Si materials per se.

In view of the above points, the present invention contemplates the achievement obtained as a result of extensive studies made comprehensively from the standpoints of applicability and utility of a-Si as a photoconductive member for image forming members for electrophotography, solid state pick-up devices and reading devices etc. It has now been found that a photoconductive member having a photoconductive layer comprising a-Si, in particular, an amorphous material constituted of at least one of hydrogen atom (H) and halogen atom (X) in a matrix of silicon [hereinafter referred to comprehensively as a-Si (H, X)], (for example, so-called hydrogenated amorphous silicon, halogenated amorphous silicon or halogen-containing hydrogenated amorphous silicon), exhibits not only practically extremely good characteristics, but also surpasses convetional photoconductive members in substantially all aspects, provided that the photoconductive member is constituted to have a specific layer structure as explained in the following. The photoconductive member has markedly excellent characteristics for electrophotography.

The present invention is based on the above mentioned discovery.

SUMMARY OF THE INVENTION

An object of the present invention is to provide a photoconductive member having substantially constantly stable electrical, optical and photoconductive characteristics, suffering from substantially no influence from the use environment, and being markedly excellent in light fatigue resistance, excellent in durability and humidity resistance without causing any deterioration phenomenon after repeated uses and entirely or substantially free from residual potentials.

Another object of the present invention is to provide a photoconductive member, which is sufficiently capable of bearing charges at the time of charging treatment for formation of electrostatic charges to an extent that a conventional electrophotographic method can be very effectively applied when it is provided for use as an image forming member for electrophotography.

Still another object of the present invention is to provide a photoconductive member for electrophotography capable of providing easily a high quality image which is free from defective images and unfocused images and is high in density, clear in half-tone and high in resolution even when used for a long time.

A further object of the present invention is to provide a photoconductive member having high photosensitivity, high SN ratio characteristic and high dielectric strength.

According to the present invention, there is provided a photoconductive member which comprises a support for a photoconductive member and an amorphous layer overlying the support and comprising a first layer region and a second layer region, the first layer region being composed of an amorphous material containing silicon atoms as a matrix, exhibiting photoconductivity, and containing a p-type impurity or an n-type impurity such that the impurity is distributed nonuniformly and continuously in the direction of the layer thickness, and the second layer region being composed of a member selected from the group consisting of an amorphous material of the formula, $Si_aC_{1-a}$ ($0.4 < a < 1$), an amorphous material of the formula, $[Si_bC_{1-b}]_cH_{1-c}$ ($0.5 < b < 1, 0.6 \leq c < 1$), an amorphous material of the formula, $[Si_dC_{1-d}]_eX_{1-e}$ ($0.47 < d < 1, 0.8 \leq e < 1$, X is a halogen atom), and an amorphous material of the formula, $[Si_fC_{1-f}]_g(H+X)_{1-g}$ ($0.47 < f < 1, 0.8 \leq g < 1$, X is a halogen atom).

DETAILED DESCRIPTION OF THE PREFERRED EMBODIMENTS

Figure 1:
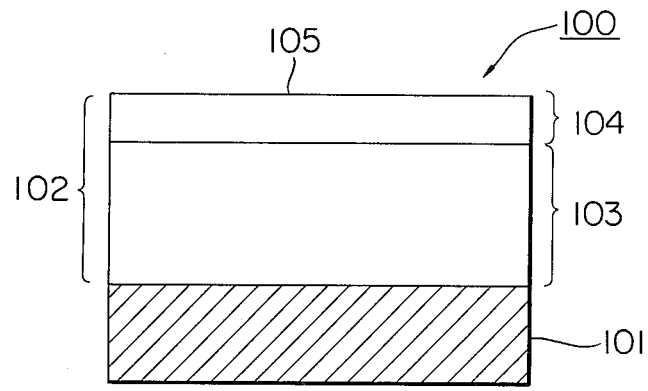
FIG. 1 shows a schematic sectional views for illustration of the layer constitution of preferred embodiments of the photoconductive member according to the present invention.

The photoconductive members of the present invention will be explained referring to the drawings below.

FIG. 1 schematically shows a layer constitution of the photoconductive member according to the present invention.

Referring to FIG. 1, a photoconductive member 100 is constituted of a support 101 for photoconductive members and an amorphous layer 102 overlying the support 101.

The amorphous layer 102 is constituted of a first layer region 103 composed of a-Si, preferably a-Si (H, X), and having photoconductivity, and a second layer region 104 composed of a member selected from the group consisting of an amorphous material of the formula, $Si_aC_{1-a}$ ($0.4 < a < 1$) (hereinafter referred to as "a-SiC"), an amorphous material of the formula, $[Si_bC_{1-b}]_cH_{1-c}$ ($0.5 < b < 1, 0.6 \leq c < 1$) (hereinafter referred to as "a-SiCH"), an amorphous material of the formula, $[Si_dC_{1-d}]_eX_{1-e}$ ($0.47 < d < 1, 0.8 \leq e < 1$, X is a halogen atom) (hereinafter referred to as "a-SiCX"), and an amorphous material of the formula, $[Si_fC_{1-f}]_g(H+X)_{1-g}$ ($0.47 < f < 1, 0.8 \leq g < 1$, X is a halogen atom) [hereinafter referred to as "a-SiC(H+X)"].

The support used for the photoconductive member in the present invention may be either electroconductive or insulating. As the electroconductive support, there may be mentioned metals such as NiCr, stainless steel, Al, Cr, Mo, Au, Nb, Ta, V, Ti, Pt, Pd, etc. or alloys thereof.

As insulating supports, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and the like. These insulating supports may suitably have at least one surface subjected to an electroconductivizing treatment, and it is desirable to provide other layers on the side to which said electroconductivizing treatment has been applied.

For example, electroconductivizing treatment of a glass can be effected by providing a thin film of NiCr, Al, Cr, Mo, Au, Ir, Nb, Ta, V, Ti, Pt, Pd, $In_2O_3$, $SnO_2$, ITO($In_2O_3 + SnO_2$) etc. thereon. Alternatively, a synthetic resin film such as polyester film can be subjected to the electroconductivizing treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The support may be shaped in any form such as cylinders, belts, plates or others, and its form may be determined as desired. For example, when the photoconductive member 100 in FIG. 1 is to be used as an image forming member for electrophotography, it may desirably be formed into an endless belt or a cylinder for use in continuous high speed copying. The support may have a thickness, which is conveniently determined so that a photoconductive member as desired may be formed. When the photoconductive member is required to have a flexibility, the support is made as thin as possible, so far as the function of a support can be exhibited. However, in such a case, the thickness is generally $10\mu$ or more from the points of fabrication and handling of the support as well as its mechanical strength.

The first layer region formed on the support and constituting a part of the amorphous layer is composed of a-Si, preferably a-Si(H, X), which exhibits photoconductivity with respect to an irradiating light.

In the present invention, formation of a first layer region constituted of a-Si(H, X) may be conducted according to the vacuum deposition method utilizing discharging phenomenon, such as glow discharge method, sputtering method or ion-plating method. For example, for formation of the first layer region constituted of a-Si(H, X) according to the glow discharge method, the basic procedure comprises introducing a starting gas for introduction of hydrogen atoms (H) and/or halogen atoms (X) together with a starting gas for supplying silicon atoms (Si) into the deposition chamber which can be internally brought to reduced pressure, wherein glow discharge is generated thereby to form a layer of a-Si(H, X) on the surface of a support placed at a predetermined position in the chamber. When it is to be formed according to the sputtering method, a starting gas for introduction of hydrogen atoms (H) and/or halogen atoms (X) may be introduced into the chamber for sputtering, when effecting sputtering using the target formed of silicon (Si) in an atmosphere of an inert gas such as Ar, He or a gas mixture based on these gases.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred with respect to easy handling during layer formation and efficiency for supplying Si.

As the effective starting gas for incorporation of halogen atoms to be used in the present invention, there may be mentioned a number of halogens compounds such as halogen gases, halides, interhalogen compounds and silane derivatives substituted with halogens which are gaseous or gasifiable.

Alternatively, it is also effective in the present invention to use a gaseous or gasifiable silicon compound containing halogen atoms which is constituted of both silicon atoms and halogen atoms.

Typical examples of halogen compounds preferably used in the present invention may include halogen gases such as fluorine, chlorine, bromine or iodine and interhalogen compounds such as $BrF$, $ClF$, $ClF_3$, $BrF_5$, $BrF_3$, $IF_3$, $IF_7$, $ICl$, $IBr$, and the like.

As the silicon compound containing halogen atom, that is, a silane derivative substituted by a halogen atom, silicon halides such as $SiF_4$, $Si_2F_6$, $SiCl_4$, $SiBr_4$, or the like are preferred.

When the specific photoconductive member of this invention is formed according to the glow discharge method by use of such a silicon compound containing halogen atoms, it is possible to form a photoconductive layer constituted of a-Si containing halogen atoms as a constituent on a given support without use of a silicon hydride gas as the starting gas capable of supplying Si.

In forming the amorphous layer containing halogen atoms according to the glow discharge method, the basic procedure comprises feeding a starting gas for supplying Si, namely a gas of silicon halide and a gas such as Ar, $H_2$, He, etc. at a predetermined ratio in a suitable amount into the deposition chamber for formation of the first layer region, followed by excitation of glow discharge to form a plasma atmosphere of these gases, thereby forming the first layer region on a support. It is also possible to form a layer by mixing a gas of a silicon compound containing hydrogen atoms at a suitable ratio with these gases in order to incorporate hydrogen atoms therein.

Each of the gases for introducing of respective atoms may be either a single species of a mixture of plural species at a predetermined ratio.

For formation of an amorphous layer of a-Si (H, X) by the reactive sputtering method or the ion-plating method, for example, a target of Si is used and sputtering is effected in a suitable gas plasma atmosphere in case of the sputtering method. Alternatively, in case of ion-plating method, a polycrystalline or single crystalline silicon is placed as a vaporization source in a vaporization boat, and the silicon vaporization source is vaporized by heating by resistance heating method or electron beam method (EB method) thereby to permit vaporized flying substances to pass through a suitable gas plasma atmosphere.

During this procedure, in either of the sputtering method or the ion-plating method, for introduction of halogen atoms into the layer formed, a gas of a halogen compound as mentioned above or a silicon compound containing halogen as mentioned above may be introduced into the deposition chamber to form a plasma atmosphere of said gas therein.

When hydrogen atoms are to be introduced, a starting gas for introduction of hydrogen atoms such as $H_2$ and a gas such as silanes are mentioned above may be introduced into the deposition chamber for sputtering, followed by formation of a plasma atmosphere of said gases.

In the present invention, as the starting gas for introduction of halogen atoms, the halogen compounds or silicon compounds containing halogens as mentioned above can effectively be used. In addition, it is also possible to use a gaseous or gasifiable halide containing hydrogen atom as one of the constituents such as hydrogen halide, including HF, HCl, HBr, HI and the like or halo-substituted hydrogenated silicon, including $SiH_2F_2$, $SiH_2I_2$, $SiH_2Cl_2$, $SiHCl_3$, $SiH_2Br_2$, $SiHBr_3$ and the like as an effective starting material for formation of the first layer region.

These halides containing hydrogen atom, which can introduce hydrogen atoms very effective for controlling electrical or optical characteristics into the layer during formation of the amorphous layer simultaneously with introduction of halogen atoms, can preferably be used as the starting material for introduction of halogen atoms.

For incorporation of hydrogen atoms structurally into the layer, alternatively, $H_2$ or a gas of silicon hydride, including $SiH_4$, $Si_2H_6$, $Si_3H_8$, $Si_4H_{10}$ and so on may be permitted to be co-present with a silicon compound for supplying Si in a deposition chamber, wherein discharging is excited.

For example, in case of the reactive sputtering method, a Si target is used and a gas for introduction of halogen atoms and $H_2$ gas are introduced together with, if necessary, an inert gas such as He, Ar, etc. into a deposition chamber, wherein a plasma atmosphere is formed to effect sputtering with said Si target, thereby forming a layer of a-Si(H, X) on the substrate.

Further there may also be introduced a gas such as of $B_2H_6$ or others in order to effect also doping of impurities.

The amount of hydrogen atoms (H) or halogen atoms (X) incorporated in the first layer region of a photoconductive member or total amount of both of these atoms, may be preferably 1 to 40 atomic %, preferably 5 to 30 atomic %.

For controlling the amounts of hydrogen atoms (H) and/or halogen atoms (X) in the layer, the support temperature and/or the amounts of the starting materials for incorporation of hydrogen atoms (H) or halogen atoms (X) to be introduced into the deposition device system, or the discharging power may be controlled.

Upon producing the first layer region of the present invention by a glow discharge method or a sputtering method, a rare gas such as He, Ne, Ar and the like may be used as a diluting gas.

The first layer region may be doped with n-type impurities or p-type impurities upon producing the layer while the doping amount is controlled.

As the p-type impurities, there may be preferably mentioned atoms belonging to group III of the periodic table such as B, Al, Ga, In, Tl and the like.

As the n-type impurities, there may be preferably mentioned atoms belonging to group V of the periodic table such as N, P, As, Sb, Bi and the like.

Among them, B, Ga, P and Sb are more preferable.

The amounts of the impurities doping the first layer to impart a desired conductivity thereto may be optionally determined depending upon the desired electrical and optical characteristics. In case of impurities of the group III, the doping amount is usually $3 \times 10^4$ atomic ppm or less. In case of impurities of the group V, it is usually $5 \times 10^3$ atomic ppm or less.

Doping the first layer region with the impurities may be effected by introducing a starting material for introducing the impurities in a gas form together with a main starting material for forming the first layer region into a deposition chamber upon producing the layer.

As the starting materials for introducing the impurities, there are preferably used such materials which are in a gas form at ambient temperature and atmospheric pressure or can be easily gasified under the layer forming conditions.

Representative starting materials for introducing the impurities are $PH_3$, $P_2H_4$, $PF_3$, $PF_5$, $PCl_3$, $AsH_3$, $AsF_3$, $AsF_5$, $AsCl_3$, $SbH_3$, $SbF_3$, $SbF_5$, $BiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $B_6H_{14}$, $AlCl_3$, $GaCl_3$, $InCl_3$, $TlCl_3$ and the like.

The thickness of the first layer region 103 may be optionally determined so that the photocarriers produced by irradiating with a light having a desired spectral characteristic may be effectively transported. The thickness is usually 1–100 microns, preferably 2–50 microns.

The group III atoms and group V atoms contained in the first layer region 103 for controlling the conductivity type and dark resistance are substantially uniformly distributed in the direction substantially parallel to the layer surface of the layer region 103 (a plane parallel to the surface of the support 101). On the contrary, these atoms are not uniformly distributed in the direction of layer thickness.

In order to achieve effectively increase in dark resistance and improvement in dielectric strength of the whole body of the amorphous layer 102, it is preferred that the above mentioned impurities are distributed nonuniformly in the first layer region 103 such that the impurities are enriched at the support 101 side portion.

In particular, where the photoconductive member is used for electrophotography, it is preferred that the group III atoms, preferably boron (B) and gallium (Ga) and the group V atoms, preferably phosphorus (P), are distributed nonuniformly. In addition, the impurities contained in the first layer region may be contained either continuously over the entire region in the direction of layer thickness or partly in the direction of layer thickness.

In the following there are described some examples of the nonuniform distribution of the impurities in the direction of layer thickness in the first layer region. For simplifying the explanation, referring is made to the group III atoms only as the impurities, but naturally the explanation is applicable to other impurities.

In FIGS. 2–10, the layer region shown is only the portion where the group III atoms are contained. The layer region (III) shown in the drawing may be equal to the entire region of the first layer region or a part of the first layer region. The impurities contained in the first layer region are desired to be contained such that the layer region (III) contain the end layer region at the support side of the first layer region.

FIGS. 2 through 10 show typical examples of the distribution in the direction of layer thickness of the group III atoms contained in the layer region (III) of the first layer region in the photoconductive member according to the present invention.

In FIGS. 2 through 10, the abscissa indicates the content C of the group III atoms and the ordinate the layer thickness of the layer region (III) containing group III atoms, $t_B$ showing the position of the interface on the support side and $t_T$ the position of the interface on the side opposite to the support side. That is, the layer region (III) containing the group III atoms is formed from the $t_B$ side toward the $t_T$ side.

In the present invention, the layer region (III) containing the group III atoms preferably comprises a-Si(H, X), and it may occupy either the whole region of the first layer region exhibiting photoconductivity or a part thereof.

In the present invention, when the aforesaid layer region (III) occupies a part of the first layer region, it is preferred in an example shown in FIG. 1 that said layer should be provided as the lower layer region of the first layer region 103 containing the interface on the side of the support.

Figure 2:
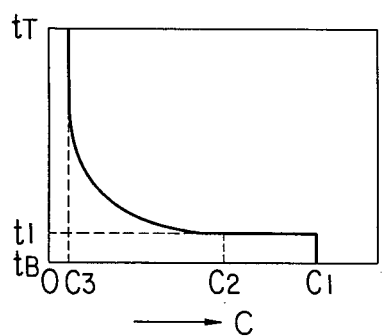
FIG. 2 through FIG. 10 show the distributions of the atoms of the group III of the Periodic table in a layer containing the atoms of the group III constituting amorphous layers.

In FIG. 2, there is shown a first typical example of the distribution of the group III atoms in the layer thickness direction contained in the layer region (III).

According to the example as shown in FIG. 2, from the interface position $t_B$ to a position $t_1$, the group III atoms are contained in the layer region formed with the concentration of the group III atoms taking a constant value $C_1$, and from the position $t_1$ to the interface position $t_T$, the concentration being gradually decreased from the concentration $C_2$. At the interface position $t_T$, the concentration C of the group III atoms is made $C_3$.

Figure 3:
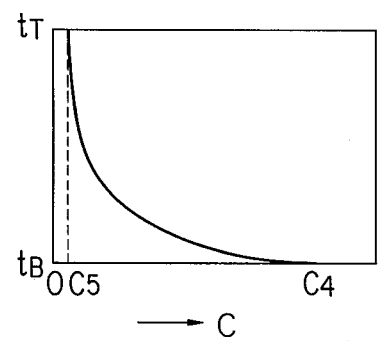

In the example as shown in FIG. 3, there is created a distribution such that the concentration C of the group III atoms is continuously gradually decreased from the position $t_B$ to the position $t_T$ from the concentration $C_4$, until it becomes the concentration $C_5$ at the position $t_T$.

Figure 4:
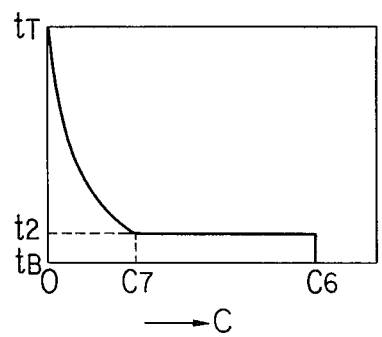

In case of FIG. 4, the concentration C of the group III atoms is maintained at a constant value of $C_6$ from the position $t_B$ to the position $t_2$, gradually continuously decreased between the position $t_2$ and the position $t_T$, and at the position $t_T$ the concentration C is made substantially zero.

Figure 5:
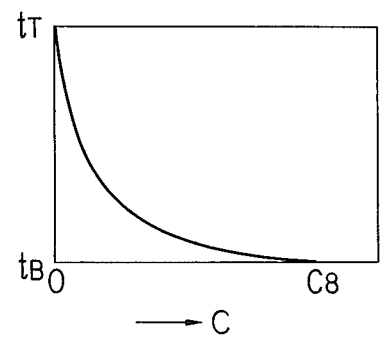

In case of FIG. 5, the group III atoms are continuously gradually decreased in concentration from the concentration $C_8$ from the position $t_B$ to the position $t_T$ at which the concentration is made substantially zero.

Figure 6:
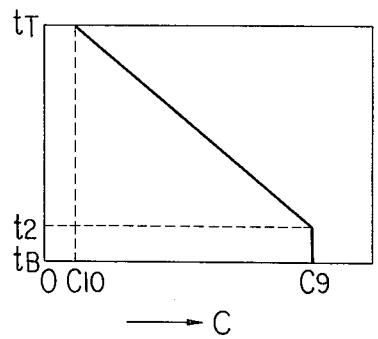

In the example shown in FIG. 6, the concentration C of the group III atoms is maintained at a constant value of $C_9$ from the position $t_B$ to $t_3$ and is made $C_{10}$ at the position $t_T$. Between the position $t_3$ and the position $t_T$, the concentration C is decreased in a linear function from the position $t_3$ to the position $t_T$.

Figure 7:
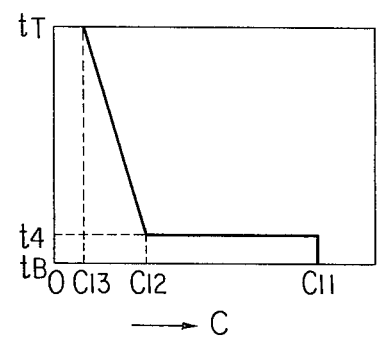

In the example as shown in FIG. 7, the distribution is made such that a constant value of $C_{11}$ is taken from the position $t_B$ to the position $t_4$, and the concentration C is decreased in a linear function from the concentration $C_{12}$ to the concentration $C_{13}$ from the position $t_4$ to the position $t_T$.

Figure 8:
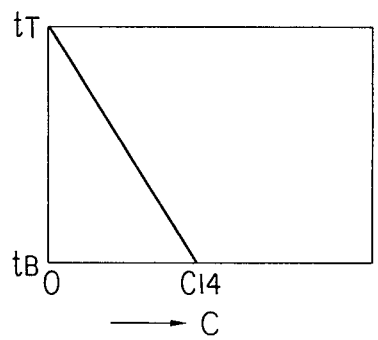

In the example as shown in FIG. 8, the concentration C of the group III atoms is decreased from the position $t_B$ to the position $t_T$ in a linear function from the concentration $C_{14}$ to zero.

Figure 9:
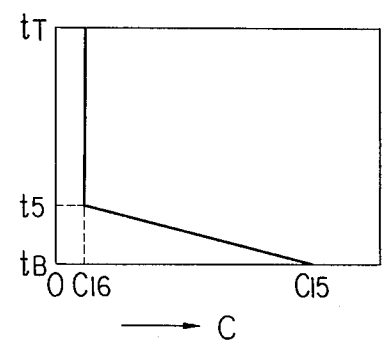

In FIG. 9, there is shown an example in which the concentration C of the group III atoms is decreased from the position $t_B$ to the position $t_5$ in a linear function from the concentration $C_{15}$ to the concentration $C_{16}$, and maintained at a constant value of $C_{16}$ between the position $t_5$ and the position $t_T$.

Figure 10:
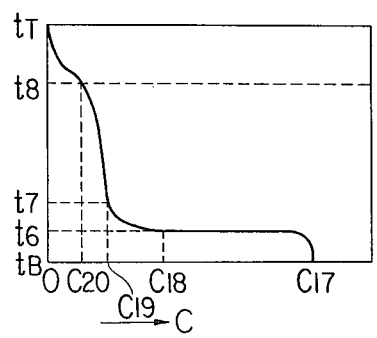

In the example as shown in FIG. 10, the concentration C of the group III atoms is the concentration $C_{17}$ at the position $t_B$, which is then initially gradually decreased to the position $t_6$ and abruptly decreased near the position $t_6$ to the concentration $C_{18}$ at position $t_6$. Between the position $t_6$ and the position $t_7$, the concentration is abruptly decreased at the beginning and then gradually decreased and becomes the concentration $C_{19}$ at the position $t_7$, and between the position $t_7$ and the position $t_8$, with a very gradual decrease, reaches the concentration $C_{20}$ at $t_8$. Between the position $t_8$ and the position $t_T$, the concentration is decreased from $C_{20}$ along the curve as shown in the drawing to substantially zero.

In the above, there are shown some typical examples of the distributions in the layer thickness direction of the group III atoms contained in the layer region (III) by referring to the FIG. 2 to FIG. 10. In the present invention, there is preferably provided in the first layer region 103 a layer region (III) having a portion with higher value of the concentration C of the group III atoms on the support side and having a portion with said concentration C which has been made considerably lower on the interface $t_T$ side, as compared with that on the support side.

In the present invention, the layer region (III) containing the group III atoms constituting the amorphous layer has a localized region (A) containing the group III atoms at higher concentration on the support side as described above.

The localized region (A) may preferably be provided at a position, in terms of the symbols shown in FIGS. 2 to 10, within $5\mu$ from the interface position $t_B$.

In the present invention, in such a case as described above, the above localized region (A) may be made the whole layer region ($L_T$) ranging from the interface position $t_B$ to the 5-micron thickness in some cases, or a part thereof in other cases.

It may be suitably determined depending on the characteristics required for the amorphous layer formed, whether the localized region (A) should be made a part or whole of the layer region ($L_T$).

The localized region (A) may be desirably formed so that the group III atoms may be distributed in the layer thickness direction with the maximum distribution value of the group III atoms (concentration distribution value) $C_{max}$ being generated 50 atomic ppm or more, preferably 80 atomic ppm or more, most preferably 100 atomic ppm or more, based on silicon atoms.

That is, in the present invention, the layer region (III) containing the group III atoms may be preferably formed so that the maximum value $C_{max}$ of the content distribution may exist at a depth within $5\mu$ of layer thickness from the support side (layer region of $5\mu$ thickness from $t_B$).

In the present invention, the content of the group III atoms to be contained in the aforesaid layer region (III) may be suitably determined as desired to achieve the object of the present invention, but it is usually in the range of from 1 to $3 \times 10^4$ atomic ppm, preferably from 2 to 500 atomic ppm, more preferably from 3 to 200 atomic ppm, based on silicon constituting the first layer region.

In the case of group V atoms, the layer is preferably constituted such that $C_{max}$ is usually 50 atomic ppm or more, preferably 80 atomic ppm or more, more preferably 100 atomic ppm or more, based on silicon.

The content of the group V atoms in the layer region (V) where the group V atoms are contained may be suitably determined as desired to achieve the object of the present invention, but it is usually in the range of from 1 to $5 \times 10^3$ atomic ppm, preferably from 1 to 300 atomic ppm, more preferably from 1 to 200 atomic ppm, based on the silicon constituting the first layer region.

In most of the examples of the first layer region constitution as mentioned above, there is a region where the concentration distribution of the group III atoms or the group V atoms gradually changes in the direction of layer thickness. This constitution serves to improve the mechanical strength of the layer and the repeating use characteristics to a great extent.

In FIG. 1, photoconductive member 100 has a second layer region 104 formed on the first layer region 103. The second layer region 104 has a free surface 105, and serves to improve mainly humidity resistance, continuous repeating use characteristics, dielectric strength, use environmental characteristics, and durability.

In the present invention, both the first and the second layer regions are composed of a common material, that is, silicon as an amorphous material, so that the laminating interface is sufficiently chemically stable.

In the present invention, the second layer region is composed of a-SiC, a-SiCH, a-SiCX, or a-SiC(H+X).

The second layer region may be produced by glow discharge method, sputtering method, ion implantation method, ion plating method, electron beam method or the like. These methods are appropriately selected depending upon the production conditions, capital investment, scale of production, desired characteristics of the photoconductive member to be produced and the like.

Electron beam method, ion plating method, glow discharge method and sputtering method are preferably employed since the production conditions for obtaining desired characteristics of the photoconductive members can be easily controlled and it is easy to introduce carbon atoms, if desired, hydrogen and/or halogen together with silicon atoms into the second layer region.

For producing the second layer region composed of a-Si by a sputtering method, a single crystalline or polycrystalline Si wafer and a C wafer, or a wafer containing both Si and C, is used as a target, and sputtering is effected in a gas atmosphere.

For example, when Si wafer and C wafer are used as targets, a sputtering gas such as He, Ne, Ar and the like is introduced into a deposition chamber for sputtering to form gas plasma, and sputtering is effected.

Alternatively, a target composed of Si and C is used and a gas for sputtering is introduced into a deposition chamber to effect sputtering.

When an electron beam method is employed, a single crystalline or polycrystalline silicon of high purity and a graphite of high purity are placed separately in two boats, respectively followed by applying electron beams to the silicon and the graphite, respectively. Alternatively, both silicon and graphite at a desired ratio are placed in a single boat and a single electron beam is applied to effect deposition.

The ratio of silicon to carbon in the resulting second layer region is controlled in the former by independently applying electron beams to the silicon and the graphite while in the latter the ratio is controlled by determining preliminarily the amount ratio of silicon to graphite in the mixture.

When an ion plating method is used, a variety of gases are introduced into a deposition chamber and a high frequency electric field is preliminarily applied to a coil arranged around the chamber to cause a glow, and deposition of Si and C is effected by using an electron beam method.

When a glow discharge method is used for forming a second layer region with a-SiCH, a starting gas for producing a-SiCH, if desired, mixed with a diluting gas at a predetermined ratio, is introduced into a deposition chamber for vacuum deposition, and the gas thus introduced is made into a gas plasma by a glow discharge to deposit a-SiCH on a first layer region which has been already formed on a support.

As the gases for forming a-SiCH, there may be used most of gaseous or gasifiable materials which can supply Si, C and H.

Combinations of the materials are, for example, as shown below.

A starting gas containing Si as a constituting atom, a starting gas containing C as a constituting atom and a starting gas containing H as a constituting atom are mixed at a desired ratio and used.

Alternatively, a starting gas containing Si as a constituting atom and a starting gas containing C and H as constituting atoms are mixed at a desired ratio and used.

Further alternatively, a starting gas containing Si as a constituting atom and a gas containing Si, C and H as constituting atoms are mixed at a desired ratio and used.

Still further alternatively, a starting gas containing Si and H as constituting atoms and a starting gas containing C as a constituting atom are mixed at a desired ratio and used.

Starting gases used for forming effectively the second layer region include hydrogenated silicon gas containing Si and H as constituting atoms, for example, silanes such as $SiH_4$, $Si_2H_6$, $Si_3H_8$, $Si_4H_{10}$ and the like, and compounds containing C and H as constituting atoms, for example, saturated hydrocarbons of $C_{1-5}$, ethylenic hydrocarbons of $C_{2-5}$, acetylenic hydrocarbons of $C_{2-4}$ and the like.

More particularly, as saturated hydrocarbons, there may be mentioned methane, ethane, propane, n-butane, pentane, and the like. As ethylenic hydrocarbons, there may be mentioned ethylene, propylene, butene-1, butene-2, isobutylene, pentene and the like. As acetylenic hydrocarbons, there may be mentioned acetylene, methylacetylene, butyne and the like.

As starting gases containing Si, C and H as constituting atoms, there may be mentioned alkyl silanes such as $Si(CH_3)_4$, $Si(C_2H_5)_4$ and the like. Other than the above mentioned starting gases, as a starting gas for introducing H, there may be naturally used $H_2$.

For producing a second layer region 104 with a-SiCH by sputtering, a single crystalline or polycrystalline Si wafer, or C wafer, or a wafer containing both Si and C as a mixture is used as a target, and sputtering is effected in a variety of gas atmosphere.

For example, when an Si wafer is used as a target, starting gases for introducing C and H may be diluted by a diluting gas, if desired, and introduced into a deposition layer for sputtering to produce gas plasma of said gases and then sputtering is effected.

Alternatively, Si and C are made into separate targets or into one single target composed of a mixture of Si and C, and these targets are used in a gas atmosphere containing at least hydrogen atoms to conduct sputtering.

As starting gases for introducing C or H, the above mentioned starting gases for glow discharge may be used effectively.

For producing a second layer region with a-SiCX by a glow discharge method, a starting gas or starting gases for forming a-SiCX, if desired, mixed with a diluting gas at a predetermined ratio, may be introduced into a deposition chamber for vacuum deposition, and glow discharge is caused to make the gas or gases into gas plasma, and as a result, a-SiCX is deposited on the first layer region formed on the support.

As a gas or gases for producing a-SiCX, there may be used most gaseous or gasifiable material or materials containing at least one of Si, C and X.

When a starting gas containing Si as a constituting atom is used, for example, there may be used a starting gas containing Si as a constituting atom, a starting gas containing C as a constituting atom and a starting gas containing X as a constituting atom mixed at a desired ratio; or there may be used a starting gas containing Si as a constituting atom and a starting gas containing C and X as constituting atoms mixed at a desired ratio; or there may be used a starting gas containing Si as a constituting atom and a starting gas containing Si, C and X as constituting atoms in a form of a mixture; or there may be used a starting gas containing Si and X as constituting atoms and a starting gas containing C as a constituting atoms in a form of a mixture.

As halogen atoms (X) incorporated in the second layer region, F, Cl, Br and I may be used, and F and Cl are preferable.

When the second layer region is constituted of a-SiCX, it is possible to incorporate hydrogen atoms in said layer region. In this case, one starting gas for forming the first layer region to introduce at least H may be also used for introducing H into the second layer region so that the production cost can be lowered when the production of the first layer region and the second layer region are carried out continuously.

As starting gases for producing the second layer region with a-SiCX or a-SiC(X+H), there may be used the starting gases as mentioned in the case of a-SiCH and other starting gases such as halogen, hydrogen halides, interhalogen compounds, silicon halides, halogen-substituted silicon hydrides, silicon hydrides and the like. As the above mentioned halogen series materials, there may be particularly mentioned:

halogen gases such as fluorine, chlorine, bromine and iodine;

hydrogen halides such as HF, HI, HCl, and HBr;

interhalogen compounds such as BrF, ClF, $ClF_3$, $ClF_5$, $BrF_5$, $BrF_3$, $IF_7$, $IF_5$, ICl, IBr, and the like;

silicon halides such as $SiF_4$, $Si_2F_6$, $SiCL_4$, $SiCl_3Br$, $SiCl_2Br_2$, $SiClBr_3$, $SiCl_3I$, $SiBr_4$ and the like;

halogen-substituted silicon hydrides such as $SiH_2F_2$, $SiH_2Cl_2$, $SiHCl_3$, $SiH_3Cl$, $SiH_3Br$, $SiH_2Br_2$, $SiHBr_3$ and the like; and silicon hydrides such as $SiH_4$, $Si_2H_6$, $Si_3H_8$, $Si_4H_{10}$ and other silanes.

In addition, the halogen series materials include halogen substituted paraffin hydrocarbons such as $CCl_4$, $CHF_3$, $CH_2F_2$, $CH_3F$, $CH_3Cl$, $CH_3Br$, $CH_3I$, $C_2C_5Cl$ and the like; sulfur fluorides such as $SF_4$, $SF_6$ and the like; and silane derivatives, for example, halogen containing alkyl silanes such as $SiCL(CH_3)_3$, $SiCl_2(CH_3)_2$, $SiCl_3CH_3$ and the like.

For producing a second layer region with a-SiCX or a-SiC(H+X) by sputtering, a single crystalline or polycrystalline Si wafer or C wafer or a wafer containing a mixture of Si and C is used as a target and sputtering is carried out in a gas atmosphere containing halogen atoms, if desired, hydrogen atoms as constituting atoms.

For example, when an Si wafer is used as a target, a starting gas for introducing C and X, if desired, together with a diluting gas, is introduced into a deposition chamber for sputtering, and gas plasma of the gas is formed, and sputtering is effected.

Alternatively, Si and C are used as separate targets or a mixture of Si and C is used as one sheet of target, and sputtering is effected in a gas atmosphere containing halogen atoms.

As materials for starting gases for introducing C and X, if desired, H, the materials for forming a second layer region 104 as shown in the above mentioned glow discharge case may be used as effective materials for sputtering.

In the present invention, starting materials for forming a second layer region are selected in such a way that silicon atoms, carbon atoms, if desired, hydrogen atoms and/or halogen atoms can be incorporated in the second layer region at a predetermined ratio.

For example, a second layer region composed of a-$Si_xC_{1-x}$:Cl:H can be produced by introducing $Si(CH_3)_4$ and a halogen introducing material such as $SiHCl_3$, $SiCl_4$, $SiH_2Cl_2$, $SiH_3Cl$, and the like in gaseous states at a predetermined ratio into a device for forming a second layer region followed by a glow discharge. $Si(CH_3)_4$ is capable of supplying silicon, carbon and hydrogen atoms and further forming desired characteristics of a second layer region.

As a diluting gas for forming a second layer region by a glow discharge or sputtering method, there may be preferably mentioned rare gases such as He, Ne, Ar and the like.

Upon forming the second layer region of the present invention, it is preferable to produce the second layer region carefully so as to impart desired characteristics thereto. That is, since the above mentioned amorphous materials constituting the second layer region exhibit electric properties ranging from electroconductivity to semiconductive property, and further to insulating property and also ranging from photoconductivity to non-photoconductivity depending upon the conditions for formation of the second layer region, it is preferable to select the conditions appropriately so as to obtain desired properties achieving the object of the invention.

For example, in case that the second layer region is provided for improving mainly the dielectric strength, the amorphous material formed should be remarkably electrically insulating under the use environment.

Further, in case that the second layer region is provided for improving mainly the continuous repeating use characteristics and the use environment characteristics, the degree of electrical insulating property as mentioned above may be somewhat low, and it is sufficient for the purpose that the amorphous material formed has a sensitivity to an irradiating light to some extent.

Upon forming a second layer region composed of the above mentioned amorphous materials on a first layer region, the support temperature during forming the layer region is an important factor affecting the constitution and characteristics of the resulting layer. Therefore, it is preferable to control the support temperature so as to impart desired characteristics to the second layer region.

The support temperature to be employed depends on the method for forming the second layer region.

In the case of using a-SiC, the support temperature is preferably 20°–300° C., more preferably 20°–250° C.

In the case of using the other amorphous materials for forming the second layer region, the support temperature is preferably 100°–300° C., more preferably 150°–250° C.

For producing the second layer region, sputtering methods and electron beam methods are advantageous since controlling delicately the atomic composition ratio of the atoms constituting the layer region and controlling the layer thickness as compared with other methods. When these layer forming methods are used for forming the second layer region, the discharge power upon layer formation as well as the support temperature is an important factor affecting the characteristics of the amorphous material formed.

For the purpose of producing effectively the abovementioned amorphous material having the desirable characteristics at a good productivity, the discharge power for producing the a-Si is preferably 50–250 W, more preferably 80–150 W.

The discharge power for producing the amorphous material constituting the second layer region is preferably 10–300 W, more preferably 20–200 W.

The gas pressure in the deposition chamber is usually 0.01–1 torr, preferably about 0.1–0.5 torr.

It is not desirable that the abovementioned desirable values of the support temperature and discharge power for producing the second layer region are separately or independently determined, but it is desirable that these layer forming conditions are determined mutually dependently with an intimate relation between them so as to produce the second layer region composed of the amorphous material having desirable characteristics.

The contents of carbon atoms, hydrogen atoms and halogen atoms contained in the amorphous material constituting the second layer region as well as the abovementioned second layer region forming conditions are also important factors to obtain the layer having desirable characteristics.

The content of each element in the amorphous material constituting the second layer region is usually as shown above.

Further, when the content is as shown below, more preferable results can be obtained.

In the case of $Si_aC_{1-a}$, the value of a is preferably $0.4 < a \leq 0.99999$, more preferably $0.5 \leq a \leq 0.99$, most preferably $0.5 \leq a \leq 0.9$.

In the case of $[Si_bC_{1-b}]_cH_{1-c}$, the value of b is preferably $0.5 < b \leq 0.99999$, more preferably $0.5 < b \leq 0.99$, most preferably $0.5 < b \leq 0.9$, and the value of c is preferably $0.6 \leq c \leq 0.99$, more preferably $0.65 \leq c \leq 0.98$, most preferably $0.7 \leq c \leq 0.95$.

In the cases of $[Si_dC_{1-d}]_eX_{1-e}$ and $[Si_fC_{1-f}]_g(H+X)_{1-g}$, the values of d and f are preferably $0.5 \leq d$, $f \leq 0.99999$, more preferably $0.5 \leq d$, $f \leq 0.99$, most preferably $0.5 \leq d$, $f \leq 0.9$, and the values of e and g are preferably $0.8 \leq e$, $g \leq 0.99$, more preferably $0.82 \leq e$, $g \leq 0.99$, most preferably $0.85 \leq e$, $g \leq 0.98$.

In the case of $[Si_fC_{1-f}]_g(H+X)_{1-g}$, the content of hydrogen atoms is preferably not more than 19 atomic %, more preferably not more than 13 atomic % based on the total amount.

The thickness of the second layer region may be appropriately selected so as to achieve the purpose of the present invention effectively.

The thickness of the second layer region may be appropriately determined depending on the relation with the thickness of the first layer region and economical conditions such as productivity, mass production and the like.

The thickness of the second layer region is usually 0.01–10 microns, preferably 0.02–5 microns, more preferably 0.04–5 microns.

The thickness of the amorphous layer of the photoconductive member of the present invention may be appropriately determined depending on the uses such as reading devices, image pick-up devices, image forming members for electrophotography.

The thickness of the amorphous layer may be appropriately determined depending on the relation between the thickness of the first layer region and that of the second layer region so that the characteristics of each of the first layer region and the second layer region can be effectively exhibited. The thickness of the first layer region is preferably from several hundreds to several thousands or more times the thickness of the second layer region.

The thickness of the amorphous layer is usually 3–100 microns, preferably 5–70 microns, more preferably 5–50 microns.

The photoconductive members according to the present invention may be produced as shown below.

Figure 11:
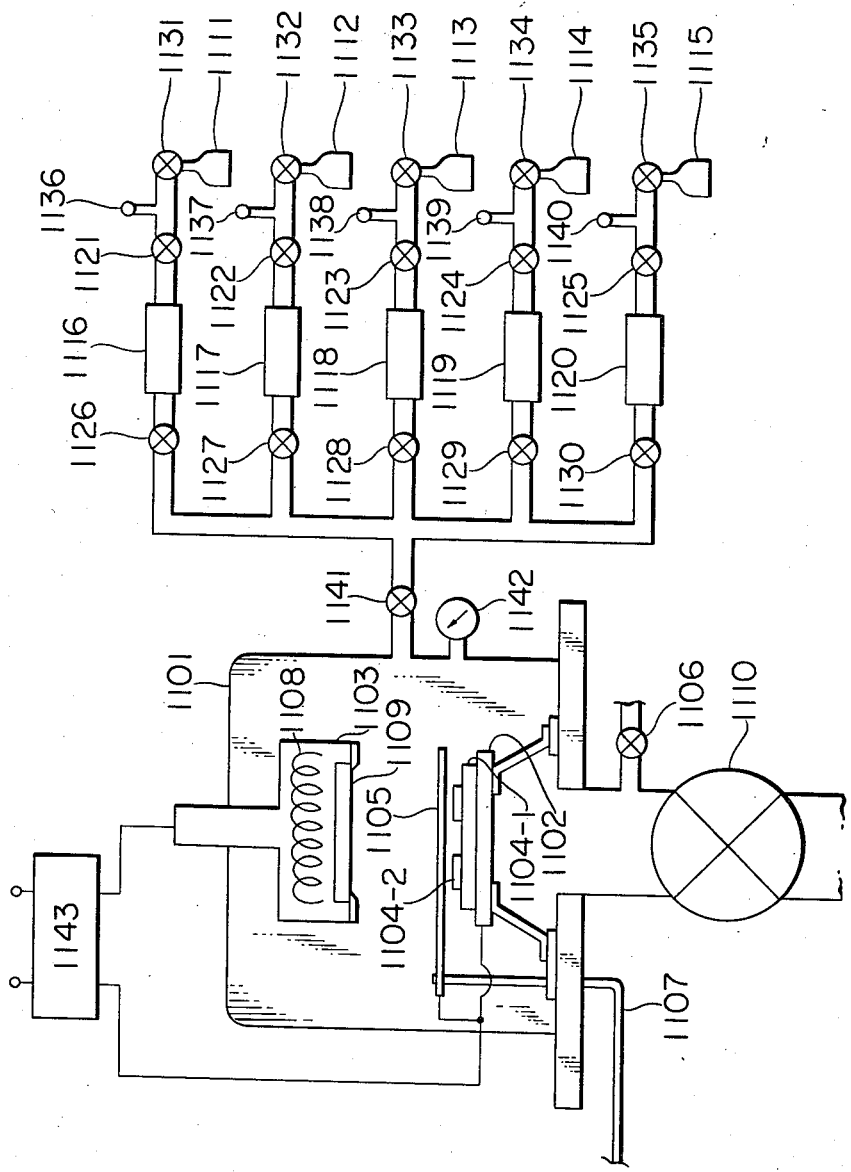
FIG. 11 and FIG. 12 schematically show devices which may be used for producing the photoconductive member of the present invention.

Referring to FIG. 11 showing a device for producing a photoconductive member by a glow discharge decomposition method and a sputtering method.

In gas bombs 1111–1115, there are hermetically contained starting gases for producing respective layer regions of the photoconductive member of the present invention. For example, bomb 1111 contains $SiH_4$ gas (purity: 99.999%) diluted with He (hereinafter referred to as "$SiH_4/He$"), bomb 1112 contains $B_2H_6$ gas (purity: 99.999%) diluted with He (hereinafter referred to as "$B_2H_6/He$"), bomb 1113 contains $Si_2H_6$ gas (purity: 99.99%) diluted with He (hereinafter referred to as "$Si_2H_6/He$"), bomb 1114 contains $SiF_4$ gas (purity: 99.999%) diluted with He (hereinafter referred to as "$SiF_4/He$"), and bomb 1115 contains Ar.

For allowing these gases to flow into a reaction chamber 1101, after confirming that valves 1131–1135 of gas bombs 1111–1115 and a leak valve 1106 are closed and inflow valves 1121–1125, outflow valve 1126–1130, and an auxiliary valve 1141 are opened, a main valve 1110 is firstly opened to evacuate the reaction chamber 1101 and the gas pipelines. When the reading on a vacuum indicator becomes about $5\times10^{-6}$ Torr, auxiliary valve 1141 and outflow valves 1126–1130 are closed.

An embodiment of forming a first layer region constituting an amorphous layer on a substrate 1109 is as shown below.

A shutter 1105 is closed and is connected such that a high voltage power can be applied from a power source 1143.

$SiH_4/He$ gas from bomb 1111 and $B_2H_6/He$ gas from bomb 1112 are permitted to flow into mass-flow controllers 1116 and 1117 by opening valves 1131 and 1132 to control outlet pressure gauges 1136 and 1137 to 1 Kg/cm$^2$ and opening gradually inflow valves 1121 and 1122, respectively. Then, outflow valves 1126 and 1127 and auxiliary valve 1141 are gradually opened to permit the respective gases to flow into reaction chamber 1101. Outflow valves 1126 and 1127 are controlled so that the flow rate ratio of $SiH_4/He$ gas to $B_2H_6/He$ gas may have a desired value, and opening of main valve 1110 is also controlled watching the reading of vacuum indicator 1142 so that the pressure in reaction chamber 1101 may reach a desired value. Then, after confirming that the temperature of substrate 1109 is 50°–400° C. by a heater 1108, a power source 1143 is set at a desired power to cause glow discharge in reaction chamber 1101 to form a first layer region on substrate 1109. Simultaneously with the formation of the first layer region, the flow rate of $B_2H_6/He$ gas is controlled following a preliminarily designed change rate curve by gradually changing the opening of valve 1127 by a manual method or by means of an externally driven motor (not shown), and as a result, the content of boron (B) in the first layer region is controlled.

For incorporating a group V atom in the first layer region in place of boron atom, in the above mentioned procedure, for example, $PH_3$ gas is used in place of $B_2H_6$ gas.

For incorporating halogen atoms in the first layer region, for example, $SiF_4/He$ gas is added to the above mentioned gases for forming the first layer region so as to feed $SiF_4/He$ gas into the reaction chamber.

A second layer region may be formed on the first layer region as shown below.

Shutter 1105 is opened, and all gas feeding valves are once closed and reaction chamber 1101 is evacuated by fully opening main valve 1110. High purity silicon wafer 1104-1 and high purity graphite 1104-2 are placed on an electrode 1102 to which a high voltage power is applied, at a desired area ratio. From bomb 1115, Ar gas is introduced into reaction chamber 1101, and main valve 1110 is controlled so that the inner pressure of reaction chamber 1101 may become 0.05–1 Torr. The high voltage power source is switched on to effect sputtering by using silicon wafer 1104-1 and graphite 1104-2 simultaneously. As a result, the second layer region is formed on the first layer region.

Alternatively, a second layer region composed of silicon atoms, carbon atoms, and fluorine atoms can be formed on the first layer region by repeating the above mentioned sputtering method except that $SiF_4/He$ gas is introduced into reaction chamber 1101 together with the Ar gas.

In the above procedure, when $SiH_4$ gas is additionally introduced into the reaction chamber, there can be formed a second layer region composed of silicon atoms, carbon atoms, fluorine atoms and hydrogen atoms.

For forming a second layer region on a first layer region by a glow discharge method, $SiH_4$ gas, $SiF_4$ gas and $C_2H_4$ are introduced into reaction chamber 1101 at a predetermined flow rate by a valve operation similar to that upon forming the first layer region, and a glow discharge is caused.

A process for producing the photoconductive member according to a glow discharge decomposition method is described below.

Figure 12:
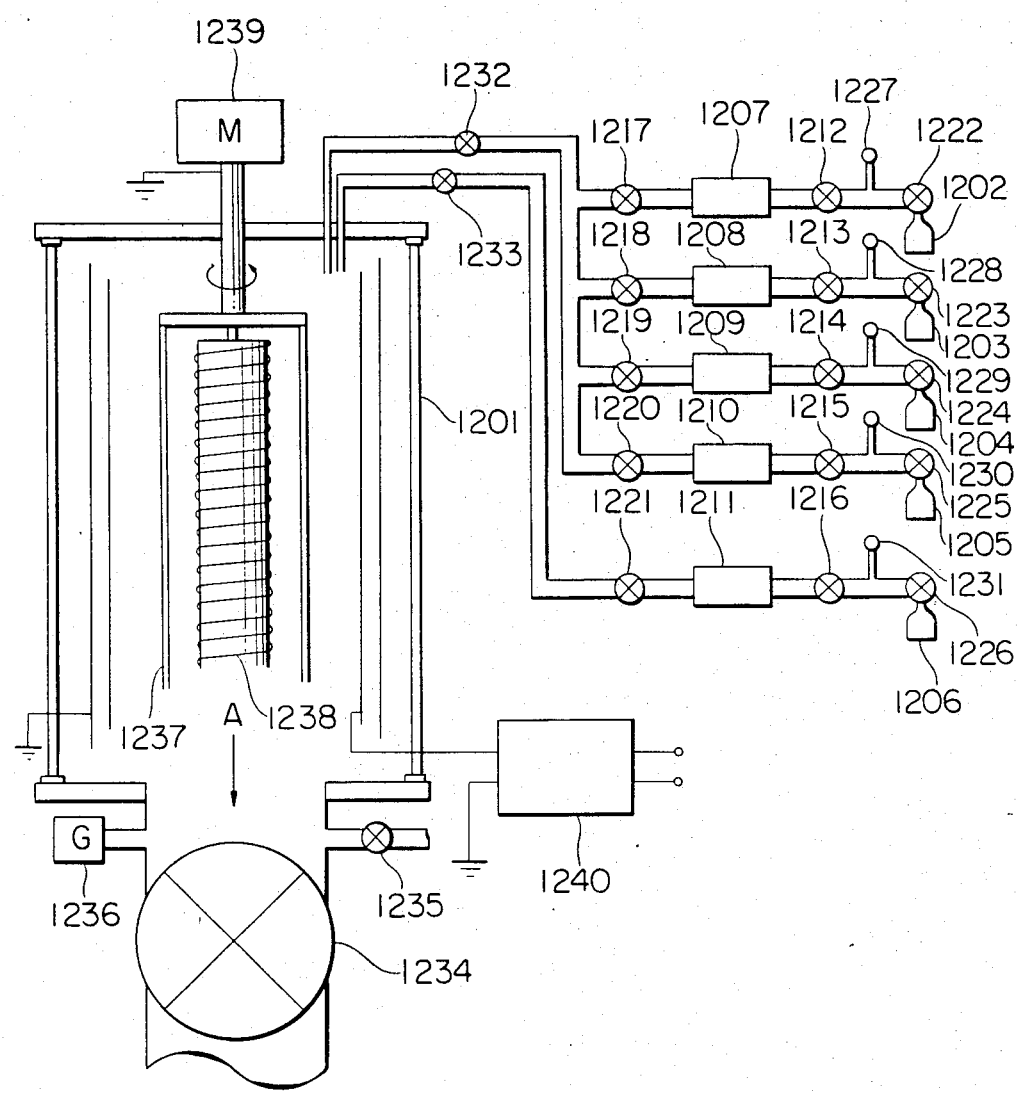

FIG. 12 shows a device for producing a photoconductive member according to a glow discharge decomposition method.

In gas bombs 1202, 1203, 1204, 1205 and 1206, there are hermetically contained starting gases for formation of respective layers of the present invention. For example, bomb 1202 contains $SiH_4/He$ gas, bomb 1203 contains $B_2H_6/He$ gas, bomb 1204 contains $Si_2H_6/He$ gas, bomb 1205 contains $SiF_4/He$ gas and bomb 1206 contains $C_2H_4$ *L gas*.

For allowing these gases to flow into the reaction chamber 1201, after confirmation of valves 1222–1226 of gas bombs 1202–1206 and a leak valve 1235 to be closed, and inflow valves 1212–1216, outflow valves 1217–1221 and auxiliary valves 1232–1233 to be opened, a main valve 1234 is first opened to evacuate a reaction chamber 1201 and the gas pipelines. As the next step, when the reading on a vacuum indicator 1236 becomes $5 \times 10^{-6}$ Torr, the auxiliary valves 1232-1233 and the outflow valves 1217-1221 are closed.

Referring now to an example of forming a first layer region on a substrate cylinder 1237, SiH$_4$He gas from the gas bomb 1202, B$_2$H$_6$/He gas from the gas bomb 1203 are permitted to flow into mass-flow controllers 1207, 1208 by opening the valves 1222, 1223 to control the pressures at the outlet pressure gauges 1227, 1228 to 1 Kg/cm$^2$ and opening gradually the inflow valves 1212, 1213. Subsequently, the outflow valves 1217, 1218 and the auxiliary valve 1232 is gradually opened to permit respective gases to flow into the reaction chamber 1201. The outflow valves 1217, 1218 are controlled so that the flow rate ratio of SiH$_4$/He to B$_2$H$_6$/He gases may have a desired value, and opening of the main valve 1234 is also controlled while watching the reading on the vacuum indicator 1236 so that the pressure in the reaction chamber 1201 may reach a desired value. And, after confirming that the temperature of the substrate cylinder 1237 is set at 50°-400° C. by the heater 1238, the power source 1240 is set at a desired power to excite glow discharge in the reaction chamber 1201 to form a first layer region on the substrate cylinder.

For introducing the group III atoms such as boron (B) and the like or the group V atoms such as phosphorus (P) and the like into a first layer region such that the distribution of the introduced atoms in the layer region is not uniform, the procedures as shown in FIG. 11 may be carried out.

In case that halogen atoms are incorporated in the first layer region, SiF$_4$/He is added to the above mentioned gas so as to introduce SiF$_4$/He into the reaction chamber.

For forming a second layer region on a first layer region, SiH$_4$ gas, SiF$_4$ gas and C$_2$H$_4$ gas are introduced into reaction chamber 1201 at a predetermined flow rate ratio by a valve operation similar to that upon forming the first layer region, and glow discharge is caused.

All the outflow valves other than those for gases necessary for formation of respective layers are, of course, closed, and during formation of respective layers, in order to avoid remaining of the gas used in the precedent layer in the reaction chamber 1201 and pipelines from the outflows valves 1217-1221 to the reaction chamber 1201, there may be conducted the procedure comprising once evacuating to a high vacuum the system by closing the outflow valves 1217-1221 and opening the auxiliary valve 1232 and 1233 with full opening of the main valve 1234, if necessary.

During formation of the layer, the substrate cylinder 1237 may be rotated at a constant speed by means of a motor 1239 in order to effect uniform layer formation.

EXAMPLE 1

By using the device for production as shown in FIG. 11, layer formation was effected on an aluminum substrate.

TABLE 1

| | Used gas | Flow rate (SCCM) | | Discharge power (W/cm$^2$) | Layer deposition rate (Å/sec) | Layer thickness ($\mu$) |
|---|---|---|---|---|---|---|
| First layer region | SiH$_4$/He = 0.5 B$_2$H$_6$/He = $10^{-3}$ | SiH$_4$ 200 | Flow rate ratio SiH$_4$:B$_2$H$_6$ = 1:10$^{-5}$~ 1:0 | 0.18 | 11 | 20 |
| Second layer region | Ar | 200 | Area ratio Si wafer: graphite = 4:6 | 0.30 | 3 | 1 |

Note:
swung dash represents "changing the flow rate ratio from one value to another". The same note applies to subsequent other tables.
Al substrate temperature: 250° C.
Discharge frequency: 13.56 MHz
Inner pressure of reaction chamber: 0.5 Torr upon forming the first layer region; 0.2 Torr upon forming the second layer region The image forming member thus produced was set in a charging-exposing-developing device, then subjected to a corona charging at ⊕5 KV for 0.2 sec, and immediately exposed to a light image. As a light source, a tungsten lamp was used to irradiate a transparent test chart at 1.0 lux.sec.

Immediately thereafter, the surface of the image forming member was developed with a negatively charged developer (toner and carrier) by cascading to produce a good toner image.

The resulting toner image was cleaned once with a rubber blade, and then the above image formation and the cleaning steps were repeated. Even when the copying was repeated 100,000 times or more, degradation of the images was not observed.

EXAMPLE 2

Layer formation was effected on an aluminum substrate by using a device for production as shown in FIG. 11.

TABLE 2

| | Used gas | Flow rate (SCCM) | | Discharge power (W/cm$^2$) | Layer deposition rate (Å/sec) | Layer thickness ($\mu$) |
|---|---|---|---|---|---|---|
| First layer | SiH$_4$/He = 0.5 B$_2$H$_6$/He = $10^{-3}$ | SiH$_4$ 200 | Flow rate ratio SiH$_4$:B$_2$H$_6$ = 1:10$^{-5}$~ | 0.18 | 11 | 20 |

TABLE 2-continued

| Used gas | Flow rate (SCCM) | | Discharge power (W/cm$^2$) | Layer deposition rate (Å/sec) | Layer thickness ($\mu$) |
|---|---|---|---|---|---|
| region | | 1:0 Area ratio | | | |
| Second layer region | Ar | 200 | Si wafer: graphite = 1:1 | 0.30 | 4 | 1.5 |

The other conditions are the same as those in Example 1.

The resulting image forming member was set in a charging-exposing-developing device and subjected to corona charging at ⊕5 KV for 0.2 sec and imagewise exposure. The exposure was effected by using a transparent test chart at 1.0 lux.sec with a tungsten lamp.

Immediately thereafter, the surface of the image forming member was developed with a negatively charged developer (toner and carrier) by cascading to produce a good toner image.

The resulting toner image was once cleaned with a rubber blade and the above image formation and cleaning steps were repeated. Even when the copying was repeated 100,000 times or more, degradation of images was not observed.

EXAMPLE 3

Layer formation was effected on an aluminum substrate by the device shown in FIG. 11.

TABLE 3

| | Used gas | Flow rate (SCCM) | | Discharge power (W/cm$^2$) | Layer deposition rate (Å/sec) | Layer thickness ($\mu$) |
|---|---|---|---|---|---|---|
| | | | Flow rate ratio | | | |
| First layer region | SiH$_4$/He = 0.5 B$_2$H$_6$/He = 10$^{-3}$ | SiH$_4$ 200 | SiH$_4$:B$_2$H$_6$ = 1:5 × 10$^{-4}$ | 0.18 | 11 | 0.2 |
| | | | Gradually changing SiH$_4$:B$_2$H$_6$ = 1:5 × 10$^{-4}$ ~ 1:10$^{-5}$ | 0.18 | 11 | 0.3 |
| | | | SiH$_4$:B$_2$H$_6$ = 1:10$^{-5}$ | 0.18 | 11 | 20 |
| | | | Area ratio | | | |
| Second layer region | Ar | 200 | Si wafer: graphite = 4:6 | 0.3 | 3 | 1 |

The other conditions were the same as those in Example 1.

The resulting image forming member was set in a charging-exposing-developing device, and subjected to corona charging at ⊕5 KV for 0.2 sec and irradiation of a light image. The light source was a tungsten lamp and the irradiation was effected by using a transparent test chart at 1.0 lux.sec. Immediately thereafter, the development was effected with a negatively charged developer (toner and carrier) on the surface of the member by cascading to produce a toner image of an extremely high density.

The resulting toner image was once cleaned with a rubber blade, and the above mentioned image formation and cleaning steps were repeated. Even if the copying is carried out over 100,000 times, degradation of images was not observed.

EXAMPLE 4

Upon producing a second layer region, the area ratio of silicon wafer to graphite was changed to change the content ratio of silicon atom to carbon atom in the second layer, but the other procedures were the same as those in Example 3 to produce an image forming member. The results are as shown in Table 4.

TABLE 4

| Si:C (Area ratio) | 9:1 | 6.5:3.5 | 4:6 Example (3) | 1.7:8.3 | 1:9 |
|---|---|---|---|---|---|
| Si:C (Atomic content ratio) | 9.7:0.3 | 8.8:1.2 | 7.3:2.7 | 4.5:5.5 | 3.1:6.9 |
| Image quality evaluation | ○ | ○ | ○ | ○ | △ |

○: Very good
△: Defective images are somewhat liable to be formed.

EXAMPLE 5

The procedures of Example 3 were repeated except that the layer thickness of a second layer region was changed. Image formation, developing and cleaning steps were repeated following the procedure of Example 1.

TABLE 5

| Thickness of second layer region | Result |
|---|---|
| 0.005$\mu$ | Defective images were liable to form. |
| 0.02$\mu$ | Defective images were sometimes formed at 20,000 times of copying. |
| 0.05$\mu$ | Stable at 20,000 times or more of copying. |
| 1$\mu$ | Stable at 100,000 times or more of copying. |

EXAMPLE 6

By repeating the procedure of Example 1 except that the conditions for forming a first layer region was as shown in Table 6, there was formed an image forming member, and the evaluation was made in a way similar to Example 1. A good result was obtained.

TABLE 6

|  | Used gas | Flow rate (SCCM) | Flow rate ratio | Discharge power (W/cm$^2$) | Layer deposition rate (Å/sec) | Layer thickness ($\mu$) |
|---|---|---|---|---|---|---|
| First layer region | $Si_2H_6$/He = 0.5<br>$B_2H_6$/He = $10^{-3}$ | $Si_2H_6$ = 170 | $Si_2H_6:B_2H_6$ =<br>$1:10^{-5}$ ~<br>1:0 | 0.54 | 40 | 20 |

EXAMPLE 7

The procedures of Example 1 were repeated except that the first layer region formation was changed as shown in Table 7 below, to produce an image forming member. Evaluation was effected in a way similar to Example 1 and a good result was obtained.

TABLE 7

|  | Used gas | Flow rate (SCCM) | Flow rate ratio | Discharge power (W/cm$^2$) | Layer deposition rate (Å/sec) | Layer thickness ($\mu$) |
|---|---|---|---|---|---|---|
| First layer region | $SiH_4$/He = 0.5<br>$SiF_4$/He = 0.5<br>$B_2H_6$/He = $10^{-3}$ | $Si_2H_6$ + $SiF_4$ = 150 | $SiH_4:SiF_4$ = 8:2<br>$(SiH_4 + SiF_4):B_2H_6$ =<br>$1:10^{-5}$ ~ 1:10 | 0.18 | 9 | 20 |

EXAMPLE 8

By using a device for production as shown in FIG. 12, layer formation was made on a drum aluminum substrate under the following conditions.

TABLE 8

|  | Used gas | Flow rate (SCCM) | Flow rate ratio | Discharge power (W/cm$^2$) | Layer deposition rate (Å/sec) | Layer thickness ($\mu$) |
|---|---|---|---|---|---|---|
| First layer region | $SiH_4$/He = 0.5<br>$B_2H_6$/He = $10^{-5}$ | $SiH_4$ 200 | $SiH_4:B_2H_6$ =<br>$1:1 \times 10^{-7}$ ~<br>1:0 | 0.18 | 11 | 20 |
| Second layer region | $SiH_4$/He = 0.5<br>$C_2H_4$ | $SiH_4$ 100 | $SiH_4:C_2H_4$ =<br>6:4 | 0.18 | 6 | 2 |

Al substrate temperature: 250° C.
Discharge frequency: 13.56 MHz
Inner pressure of reaction chamber: 0.5 torr The resulting electrophotographic image forming member was set in a copying device, and subjected to corona discharge at ⊕5 KV for 0.2 sec and irradiation of a light image at 1.0 lux.sec by a tungsten lamp. The resulting latent image was developed with a negatively charged developer (toner and carrier) and transferred to a plain paper to produce a good transferred image. Toners remaining on the image forming member without transferred were cleaned with a rubber blade and the next copying was effected. Even when such copying was repeated 100,000 times or more, degradation of images was not observed.

EXAMPLE 9

By using the device as shown in FIG. 12, layer formation was effected on a drum aluminum substrate under the following conditions.

TABLE 9

|  | Used gas | Flow rate (SCCM) | Flow rate ratio | Discharge power (W/cm$^2$) | Layer deposition rate (Å/sec) | Layer thickness ($\mu$) |
|---|---|---|---|---|---|---|
| First layer region | $SiH_4$/He = 0.5<br>$B_2H_6$/He = $10^{-3}$ | $SiH_4$ 200 | $SiH_4:B_2H_6$ =<br>$1:10^{-5}$ ~<br>$1:10^{-8}$ | 0.18 | 11 | 20 |
| Second layer region | $SiH_4$/He = 0.5<br>$C_2H_4$ | $SiH_4$ 100 | $SiH_4:C_2H_4$ =<br>5:5 | 0.18 | 6 | 3 |

The other conditions were the same as those in Example 8.

The resulting electrophotographic image forming member was set in a copying device, and subjected to corona charging at ⊕5 KV for 0.2 sec and irradiation of a light image at 1.0 lux.sec by a tungsten lamp. The resulting latent image was developed with a negatively charged developer (toner and carrier) and transferred to a plain paper to produce a very good transferred image.

The toner remaining on the image forming member without transferred was cleaned with a rubber blade, and the next copying is effected. Even when such copying was repeated 100,000 times or more, degradation of images was not observed.

EXAMPLE 10

By using a device as shown in FIG. 12, layer formation was effected on a drum aluminum substrate under the following conditions.

TABLE 10

|  | Used gas | Flow rate (SCCM) | Flow rate ratio | Discharge power (W/cm$^2$) | Layer deposition rate (Å/sec) | Layer thickness ($\mu$) |
| --- | --- | --- | --- | --- | --- | --- |
| First layer region | SiH$_4$/He = 0.5 B$_2$H$_6$/He = 10$^{-3}$ | SiH$_4$ = 200 | SiH$_4$:B$_2$H$_6$ = 1:5 × 10$^{-4}$ Gradually changing decreasingly | 0.18 | 11 | 0.2 |
|  |  |  | SiH$_4$:B$_2$H$_6$ = 1:5 × 10$^{-4}$ ~ 1:10$^{-5}$ | 0.18 | 11 | 0.3  20.5 |
|  |  |  | SiH$_4$:B$_2$H$_6$ = 1:10$^{-5}$ | 0.18 | 11 | 20 |
| Second layer region | SiH$_4$/He = 0.5 C$_2$H$_4$ | SiH$_4$ = 100 | SIH$_4$:C$_2$H$_4$ = 4:6 | 0.18 | 6 | 2 |

The resulting electrophotographic image forming member was set in a copying device, and subjected to corona charging at ⊕5 KV for 0.2 sec and irradiation of a light image at 1.0 lux.sec by a tungsten lamp. The resulting latent image was developed with a negatively charged developer (toner and carrier) and transferred to a plain paper to produce a good transferred image of a very high density. The toner remaining on the image forming member without transferred was cleaned with a rubber blade and the next copying step was effected. Even when such copying was repeated 100,000 times or more, degradation of images was not observed.

EXAMPLE 11

Upon forming a second layer region, the flow rate ratio of SiH$_4$ gas to C$_2$H$_4$ gas was changed to change the atomic content ratio of Si to C. Other than the above change, the procedures of Example 10 were repeated to effect the layer formation. The results are as shown in Table 11.

TABLE 11

| SiH$_4$:C$_2$H$_4$ | 9:1 | 6:4 | 4:6 | 1:9 |
| --- | --- | --- | --- | --- |

TABLE 11-continued

| (Flow rate ratio) Si:C | 9:1 | 7:3 | 5.5:4.5 | 3:7 |
| --- | --- | --- | --- | --- |
| (Atomic content ratio) Evaluation of image quality | ○ | ○ | ○ | Δ |

○: Very good
Δ: Defective images are somewhat liable to be formed.

EXAMPLE 12

The procedures of Example 10 were repeated except that the thickness of the second layer region was changed as shown in Table 12 below. The results are shown in Table 12.

TABLE 12

| Thickness of the second layer region | Result |
| --- | --- |
| 0.005$\mu$ | Defective images were liable to form. |
| 0.02$\mu$ | Defective images were sometimes formed at 20,000 times of copying. |
| 0.05$\mu$ | Defective images were sometimes formed at 50,000 times of copying. |
| 2$\mu$ | at 100,000 times or more of copying. |

EXAMPLE 13

The procedures of Example 8 were repeated except that the first layer region was produced under the conditions as shown in Table 13, and a good result was obtained.

TABLE 13

|  | Used gas | Flow rate (SCCM) | Flow rate ratio | Discharge power (W/cm$^2$) | Layer deposition rate (Å/sec) | Layer thickness ($\mu$) |
| --- | --- | --- | --- | --- | --- | --- |
| First layer region | Si$_2$H$_6$/He = 0.5 B$_2$H$_6$/He = 0.5 | Si$_2$H$_6$ 170 | Si$_2$H$_6$:B$_2$H$_6$ = 1:10$^{-5}$ ~ 1:0 | 0.54 | 40 | 20 |

EXAMPLE 14

The procedures of Example 8 were repeated except that the first layer region was formed under the conditions of Table 14 below, and a good result was obtained.

TABLE 14

| | Used gas | Flow rate (SCCM) | Flow rate ratio | Discharge power (W/cm$^2$) | Layer deposition rate (Å/sec) | Layer thickness ($\mu$) |
|---|---|---|---|---|---|---|
| First layer region | SiH$_4$/He = 0.5<br>SiF$_4$/He = 0.5<br>B$_2$H$_6$/He = 0.5 | SiH$_4$ + SiF$_4$ = 150 | SiH$_4$:SiF$_4$ = 8:2<br>(SiH$_4$ + SiF$_4$):B$_2$H$_6$ = 1:10$^{-5}$ ~ 1:0 | 0.18 | 9 | 20 |

EXAMPLE 15

Layer formation on an aluminum substrate was effected under the following conditions by using a device as illustrated in FIG. 11.

TABLE 15

| | Used gas | Flow rate (SCCM) | Flow rate ratio | Discharge power (W/cm$^2$) | Layer deposition rate (Å/sec) | Layer thickness ($\mu$) |
|---|---|---|---|---|---|---|
| First layer region | SiH$_4$/He = 0.5<br>B$_2$H$_6$/He = 0.5 | SiH$_4$ 200 | SiH$_4$:B$_2$H$_6$ = 1:10$^{-5}$ ~ 1:0 | 0.18 | 11 | 20 |
| Second layer region | SiH$_4$/He = 0.5<br>SiF$_4$/He = 0.5<br>C$_2$H$_4$ | SiH$_4$ + SiF$_4$ = 150 | SiH$_4$:SiF$_4$:C$_2$H$_4$ = 3:3:4 | 0.18 | 7 | 2 |

Al substrate temperature: 250° C.
Discharge frequency: 13.56 MHz
Inner pressure of reaction chamber: 0.5 Torr The resulting image forming member was set in a charging-exposing-developing device, and subjected to corona charging at ⊕5 KV for 0.2 sec immediately followed by irradiation of a light image with a tungsten lamp at 1.0 lux.sec by using a transparent test chart. Immediately thereafter, the development was effected with a negatively charged developer (toner and carrier) on the surface of the member by cascading to produce a good toner image.

The resulting toner image was once cleaned with a rubber blade, and the above mentioned image formation and cleaning steps were repeated. Even if the copying is repeated over 100,000 times, degradation of images was not observed.

EXAMPLE 16

Layer formation on an aluminum substrate was effected under the conditions in Table 16 below by the device as shown in FIG. 11.

TABLE 16

| | Used gas | Flow rate (SCCM) | Flow rate ratio | Discharge power (W/cm$^2$) | Layer deposition rate (Å/sec) | Layer thickness ($\mu$) |
|---|---|---|---|---|---|---|
| First layer region | SiH$_4$/He = 0.5<br>B$_2$H$_6$/He = 10$^{-3}$ | SiH$_4$ 200 | SiH$_4$:B$_2$H$_6$ = 1:10$^{-5}$ ~ 1:10$^{-7}$ | 0.18 | 11 | 20 |
| Second layer region | SiH$_4$/He = 0.5<br>SiF$_4$/He = 0.5<br>C$_2$H$_4$ | SiH$_4$ + SiF$_4$ = 150 | SiH$_4$:SiF$_4$:C$_2$H$_4$ = 4:2:4 | 0.18 | 8 | 2 |

The other conditions were the same as those in Example 15.

The resulting image forming member was set in a charging-exposing-developing device, and subjected to corona charging at ⊕5 KV for 0.2 sec immediately followed by irradiation of a light image with a tungsten lamp at 1.0 lux.sec by using a transparent test chart. Immediately thereafter, the development was effected with a negatively charged developer (toner and carrier) on the surface of the member by cascading to produce a good toner image. The resulting toner image was once cleaned with a rubber blade, and the above mentioned image formation and cleaning steps were repeated. Even if the copying is repeated over 100,000 times, degradation of images was not observed.

EXAMPLE 17

Layer formation on an aluminum substrate was effected under the following conditions by using a device of FIG. 11.

TABLE 17

| | Used gas | Flow rate (SCCM) | Flow rate ratio | Discharge power (W/cm$^2$) | Layer deposition rate (Å/sec) | Layer thickness ($\mu$) |
|---|---|---|---|---|---|---|
| First layer region | SiH$_4$/He = 0.5<br>B$_2$H$_6$/He = 10$^{-3}$ | SiH$_4$<br>200 | SiH$_4$:B$_2$H$_6$ =<br>1:5 × 10$^{-4}$<br>Gradually<br>changing | 0.18 | 11 | 0.2 | Total<br>20.5 |
| | | | SiH$_4$:B$_2$H$_6$ =<br>1:5 × 10$^{-4}$ ~<br>1:10$^{-5}$ | 0.18 | 11 | 0.3 |
| | | | SiH$_4$:B$_2$H$_6$ =<br>1:10$^{-5}$ | 0.18 | 11 | 20 |
| Second layer region | SiH$_4$/He = 0.5<br>SiF$_4$/He = 0.5<br>C$_2$H$_4$ | SiH$_4$ +<br>SiF$_4$ =<br>150 | SiH$_4$:SiF$_4$:<br>C$_2$H$_4$ =<br>3:2:5 | 0.18 | 8 | 2 |

The other conditions were the same as those in Example 15 above.

The resulting image forming member was set in a charging-exposing-developing device, and subjected to corona charging at ⊕5 KV for 0.2 sec immediately followed by irradiation of a light image with a tungsten lamp at 1.0 lux.sec by using a transparent test chart. Immediately thereafter, the development was effected with a negatively charged developer (toner and carrier) on the surface of the member by cascading to produce a good toner image of a very high density. The resulting toner image was once cleaned with a rubber blade, and the above mentioned image formation and cleaning steps were repeated. Even if the copying is repeated over 100,000 times, degradation of images was not observed.

EXAMPLE 18

The procedures of Example 17 were repeated except that upon producing the second layer region the flow rate ratio of SiH$_4$:SiF$_4$:C$_2$H$_4$ was changed so as to change the atomic content ratio of silicon to carbon in the second layer region. In each case, the thickness of the second layer region was constantly 2$\mu$ though the layer deposition rate was varied. The results are shown in Table 18 below.

EXAMPLE 19

The procedures of Example 17 were repeated to form image forming members except that the thickness of the second layer region was varied, and the image forming, developing and cleaning steps as in Example 15 were repeated. The results are as shown below.

TABLE 19

| Thickness of the second layer region | Result |
|---|---|
| 0.005$\mu$ | Defective images were liable to form. |
| 0.02$\mu$ | Defective images formed sometimes when the copying was repeated 20,000 times. |
| 0.05$\mu$ | Defective images formed sometimes when the copying was repeated 50,000 times or more. |
| 1$\mu$ | Stable when the copying was repeated 10,000 times or more. |

EXAMPLE 20

The procedures of Example 15 were repeated to form an image forming member except that the manner of forming the first layer region was changed as shown in Table 20, and the result was evaluated as in Example 15. The result was good.

TABLE 20

| | Used gas | Flow rate (SCCM) | Flow rate ratio | Discharge power (W/cm$^2$) | Layer deposition rate (Å/sec) | Layer thickness ($\mu$) |
|---|---|---|---|---|---|---|
| First layer region | SiH$_4$/He = 0.5<br>SiF$_4$/He = 0.5<br>B$_2$H$_6$/He = 0.5 | SiH$_4$ +<br>SiF$_4$ =<br>150 | SiH$_4$:SiF$_4$ =<br>8:2<br>(SiH$_4$ + SiF$_4$):<br>B$_2$H$_6$ =<br>1:10$^{-5}$ ~<br>1:10$^{-6}$ | 0.18 | 9 | 20 |

TABLE 18

| SiH$_4$:SiF$_4$:C$_2$H$_4$<br>(Flow rate ratio) | 5:4:1 | 3.5:3:3.5 | 2:2:6 | 1:0.7:8.3 | 0.5:0.5:9 |
|---|---|---|---|---|---|
| Si:C<br>(Atomic content ratio) | 9.5:0.5 | 8.7:1.3 | 7:3 | 4.5:5.5 | 2.9:7.1 |
| | ○ | ○ | ○ | ○Δ | Δ |

○ : Very good
○ Δ: Defective images formed somewhat.
Δ: Defective images are liable to form.

EXAMPLE 21

The procedures of Example 17 were repeated to form an image forming member except that the second layer region was produced under the conditions in Table 21 below by a sputtering method, and evaluation was made in the same manner as in Example 17. The result was good.

TABLE 21

| | Used gas | Flow rate (SCCM) | Area ratio | Discharge power (W/cm$^2$) | Layer deposition rate (Å/sec) | Layer thickness ($\mu$) |
|---|---|---|---|---|---|---|
| Second layer region | Ar SiF$_4$/He = 0.5 | Ar 200 SiF$_4$ 100 | Si wafer: graphite = 7:3 | 0.30 | 3 | 1 |

EXAMPLE 22

Layer formation was effected on an aluminum substrate under the conditions as shown in Table 22 by using the device of FIG. 12.

TABLE 22

| | Used gas | Flow rate (SCCM) | Flow rate ratio | Discharge power (W/cm$^2$) | Layer deposition rate (Å/sec) | Layer thickness ($\mu$) |
|---|---|---|---|---|---|---|
| First layer region | SiH$_4$/He = 0.5 PH$_3$/He = 10$^{-3}$ | SiH$_4$ = 200 | Gradually changing SiH$_4$:PH$_3$ = 1:5 × 10$^{-6}$ ~ 1:10$^{-6}$ | 0.18 | 11 | 0.3  20.3 |
| | SiH$_4$/He = 0.5 | SiH$_4$ = 200 | | 0.18 | 11 | 20 |
| Second layer region | SiH$_4$/He = 0.5 C$_2$H$_4$ | SiH$_4$ 100 | SiH$_4$:C$_2$H$_4$ = 4:6 | 0.18 | 6 | 2 |

The resulting electrophotographic image forming member was set in a copying device, and subjected to corona charging at ⊖5 KV for 0.2 sec followed by irradiation of a light image with a tungsten lamp at 1.0 lux.sec.

The latent image was developed with a positively charged developer (toner and carrier) and the developed image was transferred to a plain paper. The resulting transferred image was good and had a very high density. The remaining toner on the electrophotographic image forming member without transferred was cleaned with a rubber blade, and then the next copying step was effected. Degradation of images was not observed even if the copying is repeated 100,000 times or more.

EXAMPLE 23

Upon forming the second layer region, the procedures of Example 22 were repeated to produce an image forming member except that the atomic content ratio of silicon to carbon in the second layer region was changed. The results are as shown below.

TABLE 23

| SiH$_4$:C$_2$H$_4$ (Flow rate ratio) | 9:1 | 6:4 | 4:6 | 1:9 |
|---|---|---|---|---|
| Si:C (Atomic content ratio) | 9:1 | 7:3 | 5.5:4.5 | 3:7 |
| Evaluation of image quality | ○ | ○ | ○ | △ |

○: Very good
△: Defective images formed somewhat.

What is claimed is:

1. A photoconductive member which comprises a support for a photoconductive member and an amorphous layer overlying the support and comprising a first layer region and a second layer region, the first layer region being composed of an amorphous material containing silicon atoms as a matrix at least one of hydrogen atoms or halogen atoms, exhibiting photoconductivity, and containing a p-type impurity or an n-type impurity such that the impurity is distributed nonuniformly and continuously in the direction of the layer thickness and substantially uniformly in the direction substantially parallel to the layer surface, and the second layer region being composed of a member selected from the group consisting of an amorphous material of the formula, Si$_a$C$_{1-a}$ (0.4<a<1), an amorphous material of the formula, [Si$_b$C$_{1-b}$]$_c$H$_{1-c}$ (0.5<b<1, 0.6≦c<1), an amorphous material of the formula, [Si$_d$C$_{1-d}$]$_e$X$_{1-e}$ (0.47<d<1, 0.8≦e<1, X is a halogen atom), and an amorphous material of the formula, [Si$_f$C$_{1-f}$]$_g$(H+X)$_{1-g}$ (0.47<f<1, 0.8≦g<1, X is a halogen atom).

2. A photoconductive member according to claim 1 in which the impurity is distributed in the first layer region such that the content of the impurity continuously decreases from the support side to the side opposite to the support.

3. A photoconductive member according to claim 1 in which the impurity is distributed in a higher content at the support side.

4. A photoconductive member according to claim 1 in which the region of a high impurity content is present within a distance of 5 microns from the support.

5. A photoconductive member according to claim 1 in which the first layer region contains a p-type impurity.

6. A photoconductive member according to claim 5 in which the p-type impurity is an atom selected from the group III of the periodic table.

7. A photoconductive member according to claim 6 in whcih the atom is B, Al, Ga, In, or Tl.

8. A photoconductive member according to claim 1 in which the first layer region contains an n-type impurity.

9. A photoconductive member according to claim 8 in which the n-type impurity is an atom selected from the group V of the periodic table.

10. A photoconductive member according to claim 9 in which the atom is N, P, As, Sb or Bi.

11. A photoconductive member according to claim 5 in which the content of the p-type impurity in the first layer region is 3×10$^4$ atomic ppm or less.

12. A photoconductive member according to claim 8 in which the content of the n-type impurity in the first layer region is $5 \times 10^3$ atomic ppm or less.

13. A photoconductive member according to claim 1 in which the first layer region contains hydrogen atom.

14. A photoconductive member according to claim 13 in which the content of hydrogen atom in the first layer region is 1–40 atomic %.

15. A photoconductive member according to claim 1 in which the first layer region contains halogen atom.

16. A photoconductive member according to claim 15 in which the content of halogen atom in the first layer region is 1–40 atomic %.

17. A photoconductive member according to claim 1 in which the first layer region contains hydrogen atom and halogen atom.

18. A photoconductive member according to claim 17 in which the total content of hydrogen atom and halogen in the first layer region is 1–40 atomic %.

19. A photoconductive member according to claim 1 in which the second layer region is 0.01–10 microns thick.

20. A photoconductive member according to claim 1 in which the amorphous layer is 3–100 microns thick.

21. A photoconductive member according to claim 1, in which the support is in a belt like form.

22. A photoconductive member according to claim 1, in which the support is in a cylindrical form.

23. A photoconductive member according to claim 1, in which the support is a synthetic resin film provided with electroconductivity at the surface.

24. A photoconductive member according to claim 1, in which the layer thickness of the first layer region is 1–100μ.

25. A photoconductive member according to claim 1, in which the layer region containing the impurity occupies the whole layer region of the first layer region.

26. A photoconductive member according to claim 1, in which the layer region containing the impurity occupies a part of the first layer region.

27. A photoconductive member according to claim 1, in which the layer region containing the impurity is provided in the end portion of the first layer region on the support side.

28. A photoconductive member according to claim 1, in which the concentration distribution line of the impurity in the direction of layer thickness has a distribution region in which the concentration is continuously decreased from the support side toward the layer surface.

29. A photoconductive member according to claim 1, in which the layer region containing the impurity has a localized region containing the impurity at higher concentration in the end portion on the support side.

30. A photoconductive member according to clain 29, in which the maximum of concentration distribution of the impurity, $C_{max}$ is 50 atomic ppm or more.

31. A photoconductive member according to claim 30, in which the maximum $C_{max}$ exist at a depth within 5μ of layer thickness from the support side.

* * * * *

UNITED STATES PATENT AND TRADEMARK OFFICE
CERTIFICATE OF CORRECTION

PATENT NO. : 4,465,750
DATED : 08/14/84
INVENTOR(S) : Kyosuke Ogawa et al.

It is certified that error appears in the above-identified patent and that said Letters Patent is hereby corrected as shown below:

The term of this patent subsequent to December 27, 2000, has been disclaimed.

Signed and Sealed this

Fifth Day of February 1985

[SEAL]

Attest:

DONALD J. QUIGG

Attesting Officer    Acting Commissioner of Patents and Trademarks

UNITED STATES PATENT AND TRADEMARK OFFICE
CERTIFICATE OF CORRECTION

PATENT NO. : 4,465,750                             Page 1 of 2

DATED      : August 14, 1984

INVENTOR(S): Ogawa et al.

It is certified that error appears in the above-identified patent and that said Letters Patent is hereby corrected as shown below:

IN THE ABSTRACT:

line 2, change "COMPSED" to --COMPOSED--.

IN THE SPECIFICATION:

Column 12, line 53, change "$C_2C_5Cl$" to --$C_2H_5Cl$--.

Column 15, line 63, change "50°" to --50-- and "C." to --C--.

Column 16, line 60, change "$C_2H_4L$" to --$C_2H_4$--.

Column 17, line 40, change "50°" to --to-- and "C." to --C--.

Column 18, Table 1 and Table 2, move "Flow Rate Ratio" up above line Note, before "swung" insert --The--.

Column 19, Table 3, move "Flow Rate Ratio" up above line.

Column 23, Table 10, (last entry in Column 4 of Table 10), change "$SIH_4:C_2H_4$" to --$SiH_4:C_2H_4$--.

UNITED STATES PATENT AND TRADEMARK OFFICE
CERTIFICATE OF CORRECTION

PATENT NO. : 4,465,750

DATED : August 14, 1984

INVENTOR(S) : Ogawa et al.

It is certified that error appears in the above-identified patent and that said Letters Patent is hereby corrected as shown below:

Column 24, line 2, "(Flow rate ratio)" should be moved to above the line.

Column 24, line 44, before "at 100,000" insert --stable--.

Column 29, line 58, before "Very good" insert --O--.

Column 30, line 57, change "whcih" to --which--.

Signed and Sealed this

Twenty-third Day of July 1985

[SEAL]

Attest:

DONALD J. QUIGG

Attesting Officer

Acting Commissioner of Patents and Trademarks